PRODUCTION OF PLASTIC PRINTING PLATES

Filed Nov. 14, 1966

INVENTORS
Eugene L. Bernardi
Henry A. Krysiak
BY
Pennie, Edmonds, Morton, Taylor & Adams
ATTORNEYS 3,479,952

PRODUCTION OF PLASTIC PRINTING PLATES

Eugene L. Bernardi, Oakland, and Henry A. Krysiak, Lorenzo, Calif., assignors to Reichhold Chemicals, Inc., White Plains, N.Y., a corporation of Delaware Continuation-in-part of application Ser. No. 331,624, Dec. 18, 1963. This application Nov. 14, 1966, Ser. No. 593,761
Int. Cl. B41c; C08f *21/00;* B41n *1/00*
U.S. Cl. 101—401.1 19 Claims

ABSTRACT OF THE DISCLOSURE

A process for producing plastic printing plates wherein a thermosetting polymeric resin composition in liquid form is spread onto a matrix having a relief image and is subsequently cured at elevated temperatures over a period of time not exceeding ten minutes to form a printing plate having a high fidelity relief surface image opposite that of the matrix.

This application is a continuation-in-part of our copending application Ser. No. 248,700, filed Dec. 31, 1962 and Ser. No. 331,624, filed Dec. 18, 1963.

This invention relates to the production of plastic printing plates and is based on the discovery that certain liquid resin compositions may be rapidly cured in a matrix to form a plastic printing plate having a relief image face characterized by good ink transfer properties and high image fidelity, substantially the entire composition of which plate is a cross-linked polymer system.

In its broadest terms, the invention provides an improved method of producing a plastic printing plate which comprises (i) pouring a liquid resin composition which contains a thermosetting polymer system and which is capable of being cured fairly rapidly to a dimensionally stable solid having good ink transfer properties and high image fidelity onto a matrix (or "mat") having a relief image on one face thereof so that the liquid resin composition completely covers the image face of the matrix, (ii) curing the liquid resin composition to its solid state over a period of time not exceeding ten minutes following the pouring of the resin composition onto the matrix, without, however, bonding the resin composition to the image face of the matrix, thereby forming a plastic printing plate having a high fidelity relief surface opposite that of the image face of the matrix, and (iii) removing the resultant plastic printing plate from the matrix. The widespread utility of the plastic printing plates produced in accordance with the invention, as well as the improved features which characterize this new method when compared to the techniques employed in producing the printing plates currently in use commercially, may be better understood by describing briefly those procedures and devices now generally in use throughout the printing industry.

In the newspaper industry, each page of the paper is usually set up initially in a flat form known as the page make-up. The page make-up includes linotype material, zinc or other engravings, flat plate lead castings, ludlow type, and other similar materials, all oriented relative to one another in the desired position for printing the page. After the flat form is thus set up, a flat sheet of embossable material is placed over the top of the form. The form and overlying sheet are then passed under a roller suitable for applying high pressure against the sheet, whereby the various relief features of the page form are impressed into the sheet. The sheet used is generally made from a wood and cellulose fiber composition, and the resultant embossed product is commonly referred to as a "mat," this being an abbreviation for the term matrix.

The embossed mat is formed into a generally arcuate shape, after which it is used to mold a curved lead plate casting having a relief image on its outer convex surface. This curved lead plate has its inside surface machined to a precision cylindrical shape, and is then suitably mounted on a rotary press after which it is ready to print the page.

With respect to the various flat lead plates, engravings, and the like, used in making up the page form, it is to be noted that reproduction of a picture must always entail the production of a zinc, copper or other engraving. While these engravings may themselves be used directly in the page make-up, or for that matter, in direct printing with a flat press, the cost of making engravings is relatively expensive and their use is somewhat limited. Where widespread distribution of a picture or similar reproduction is desired, it is generally not feasible to send out engravings to each of the newspapers, or to other points of publication. Similarly, it is time-consuming and expensive for advertisers to have their advertisement layouts set up individually for each newspaper. Consequently, the engraving or other layout is frequently used to make a flat mat having an inverse image of the engraving or layout. This mat is formed by pressure in substantially the same manner as noted above, except that the mat is not formed into an arcuate shape, and need be made only to the size of the engraving or advertising layout. A large number of these flat mats are made and sent out to each of the desired points of publication. When for example, a newspaper wants to use the mat for page make-up, a flat lead casting is formed from the mat. This process includes pouring a molten mixture of lead, tin, and antimony into a casting box, allowing it to cool, and shaving the back of the cast plate to achieve a relatively thin predetermined thickness. The flat lead plate thus formed can be used in the page make-up in the manner described hereinabove, whereby the subject matter of the distributed mat eventually forms a part of the full page reproduction. Where full page ads are used, it is still necessary to distribute a flat mat and form a flat lead casting therefrom. The flat plate is then used to form a curved mat and curved lead plate in the manner described above.

In the publication and distribution of national magazine, it is sometimes found more practical to set up regional printing operations where production can be done for local distribution. The use of lead printing plates in the publication of magazines generally is not adequate for the type of quality reproduction desired. Consequently, it is the general practice in the magazine industry to print with electro-plated printing plates. These plates are generally made up as follows: at the main office of the magazine, a plurality of vinyl mats are formed representing each page of the magazine. A rather lengthy procedure is then used to form an electro shell of copper within the vinyl mat, this procedure generally takes about 3½ to 4 hours. All the mats, with the electro shell thereon, are then shipped to various regional points of distribution for the magazine. At these points, it is then necessary to mold a lead backing onto the electro shell. The procedure of forming the lead backing generally causes irregularities in the face of the electro-plate whereby a time consuming task of removing these irregularities is necessitated. After the face is prepared, the whole plate is bent into a generally arcuate form, after which it is ready for mounting on rotary presses. An alternate procedure sometimes used with magazines is to form the vinyl mat into a curved shape after which the electro shell is formed, whereby the electro shell is preformed into a curved shape. A centrifugal pouring method is then used to form the lead backing into the electro shell at the regional points of distribution for the magazine. Although rubber printing plates are sometimes used to print on relatively soft materials, such as cardboard or various wax treated paper products, the use of rubber plates generally does not provide a high quality and detailed reproduction. Plastic printing plates formed in accordance with the present invention can be used in various ways to reduce the time and expense involved in the existing printing methods as outlined above, as well as improve the quality in several respects. Instead of sending mats to numerous points of publication, it is possible with the present invention to send lightweight, inexpensive plastic plates. These plates can be used directly in the page-make-up procedures noted above, instead of necessitating the formation of a flat plate lead casting with each mat at each newpaper. In addition, full page plastic plates can be made from a flat mat, with the plastic printing plates themselves being suitable for direct mounting on a rotary press without need for forming a curved lead plate casting. Thus, national magazines can send out to each regional operation a complete set of plastic plates ready for mounting on the presses, and the time and expense of forming electro shells, and mounting the lead backings at each point of distribution, is eliminated. Furthermore, in multicolor printing for newspapers and other publications, plastic plates for each color can be made from a flat mat taken directly from the engraving or other layout, with the plastic plates thus formed being directly mounted on the rotary press. This eliminates the steps of forming a curved mat and then a curved lead casting for each color plate. Plastic printing plates made in accordance with the present invention can also be used in those situations where rubber plates are presently being used. Unlike rubber, however, these plastic printing plates are capable of providing a high quality and detailed reproduction, yet without having too hard a printing face which would tend to injure the material to be printed.

Apart from the foregoing advantages in time and expense savings, the plastic printing plates produced in accordance with the invention afford much improved quality features over lead plate castings. In particular, the plastic printing plate of the present invention affords an extremely sharp and well-defined relief image (which is herein called "high image fidelity"), whereby the reproduction achieved from direct printing with the instant plate has clearer definition than has been heretofore possible with similar lead plates. The use of lead plates in the newspaper industry makes it impractical to print a halftone reproduction of finer quality than 65 lines per inch, since the lead material cannot be molded to much detail. However, a plastic printing plate made in accordance with the present invention can be used to make a 100 line, or more, halftone screen that has a quality visibly superior to that presently achievable with ordinary lead plates. Even when a plastic plate is used in a page make-up from which a curved lead plate is ultimately formed, the reproduction is improved over that achieved with a flat lead plate casting used in the page make-up. Another important advantage in printing directly with the plastic plates of the present invention is that substantially all the ink applied to the plate is transferred to the paper or other surface to be printed. In comparison, lead cast plates have a relatively porous surface, whereby it is not possible to achieve a high percentage of ink transfer. Consequently, the lead plates must literally be flooded with ink to achieve satisfactory reproduction. Thus, the use of plastic plates reduces much of the ink wastage encountered with lead plates, in addition to achieving a clearer and more well defined print.

Accordingly, it is a main object of the present invention to provide for the ready production of plastic printing plates suitable for use either in direct printing, or in the formation of embossed matrices. These plastic printing plates have good ink transfer properties, namely smooth nonporous surfaces capable of providing substantially total ink transfer to the surface to be printed. Moreover, these plastic printing plates possess high image fidelity or, put another way are capable of making reproductions with improved quality and definition as compared to conventional lead plate castings, and are comparable to reproductions made with the electro-plates printing plates used in the magazine industry, but with a substantial reduction of the time and expense involved therewith. The plates herein are durable and rugged. They produce relief images of uniform hardness and have a long shelf life; they can be made in varying degrees of hardness and flexibility and are thus suitable for a variety of uses.

Another object of this invention is the provision of a flexible flat plastic printing plate suitable for direct mounting on a rotary printing press, whereby the plate is particularly useful in multicolor printing and also for full page printing in newspapers, magazines, and the like.

A further object of this invention is to provide a method and composition for forming plastic printing plates in a quick and simple manner, using techniques which effectuate substantial economies.

It is a further object of this invention to produce a plastic printing plate in less than four minutes after pouring of the liquid resin onto the matrix and which can immediately be used, after cooling, as a printing plate.

This invention possesses other objects and features of advantages, some of which of the foregoing will be set forth in the following description of the preferred form of the invention which is illustrated in the drawing accompanying and forming part of this specification. It is to be understood, however, that variations in the showing made by the said drawing and description may be adopted within the scope of the invention as set forth in the claims.

Referring to the drawings.

Figure 1:
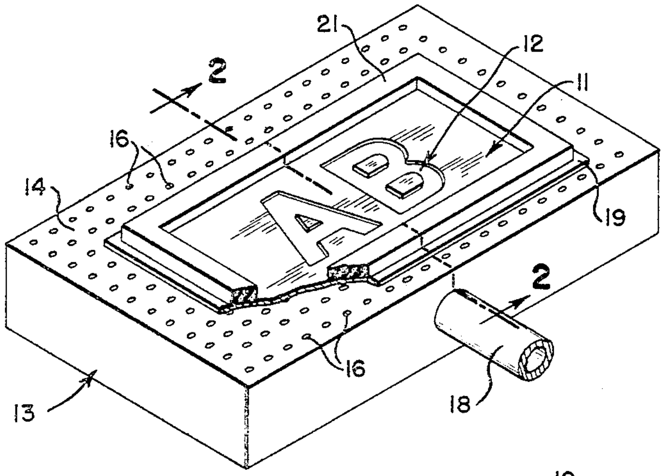
FIG. 1 is a perspective view of a structure used in forming a printing plate in accordance with the present invention.

The method of the present invention generally comprises the use of a matrix 11, as shown for example in FIG. 1, with the matrix having a relief image 12 on one of its faces. A liquid resin composition, which contains a thermosetting polymer system and a curing agent and which is capable of being cured rapidly at elevated temperatures and at pressures in the range from about atmospheric pressures to not more than 400 p.s.i. to a dimensionally stable solid having good ink transfer properties and high image fidelity, is poured into a casting space adjacent the image and allowed to gel and either partially or completely cure into a cast of a printing plate over a period of time not exceeding ten minutes following the pouring of the resin composition, without, however, bonding to the matrix. After the resin composition has been partially (i.e., gelled) or completely cured, the cast is removed from the matrix. The resultant cast plate has a relief image inverse to that on the matrix. Depending upon the type of thermosetting polymer system utilized, various techniques may be employed to effect the cure.

Figure 2:
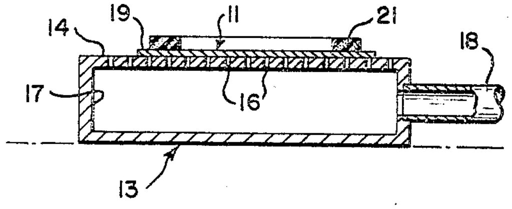
FIG. 2 is a cross-sectional view taken along the plane of line 2—2 as shown in FIG. 1.

One particular embodiment of the invention relates to an open bed casting procedure, and utilizes a casting bed 13, as shown in FIGS. 1 and 2. The bed 13 has an upper surface 14, which is precision formed to achieve a substantially perfect flatness. A large multiplicity of closely spaced vacuum holes 16 are disposed for drawing a reduced air pressure through these holes.

Preferably, the bed 13 is formed with a hollow chamber 17, with a conduit 18 communicating with the chamber and adapted for coupling to suitable source of reduced air pressure. The matrix 11 is placed over the surface 14 and a vacuum is applied through the holes 16 to draw the matrix uniformly against the bed surface. In this manner it is assured that the cast plate will have a uniformly flat image surface. As shown in the drawing, the matrix 11 has a margin or peripheral "bearer" region 19 which does not form a part of the surface to be reproduced. A cofferdam 21 is placed along the bearer region for defining the casting space into which the liquid resin composition is placed. The material of this dam should be non-adhering to the resin composition. Preferably, the cofferdam is formed of self-adhesive sponge rubber strips that can be laid along the margin and applied by finger pressure. The liquid resin composition can then be poured or otherwise placed over the matrix and retained by the cofferdam, the casting bed being suitably supported to have the surface 14 generally horizontally disposed. The plastic cast formed in the manner just described has a precision flat image surface, and can be run through a planing machine to shave the back surface of the cast to provide a printing plate having a uniform predetermined thickness.

Figures 3, 4, 5:
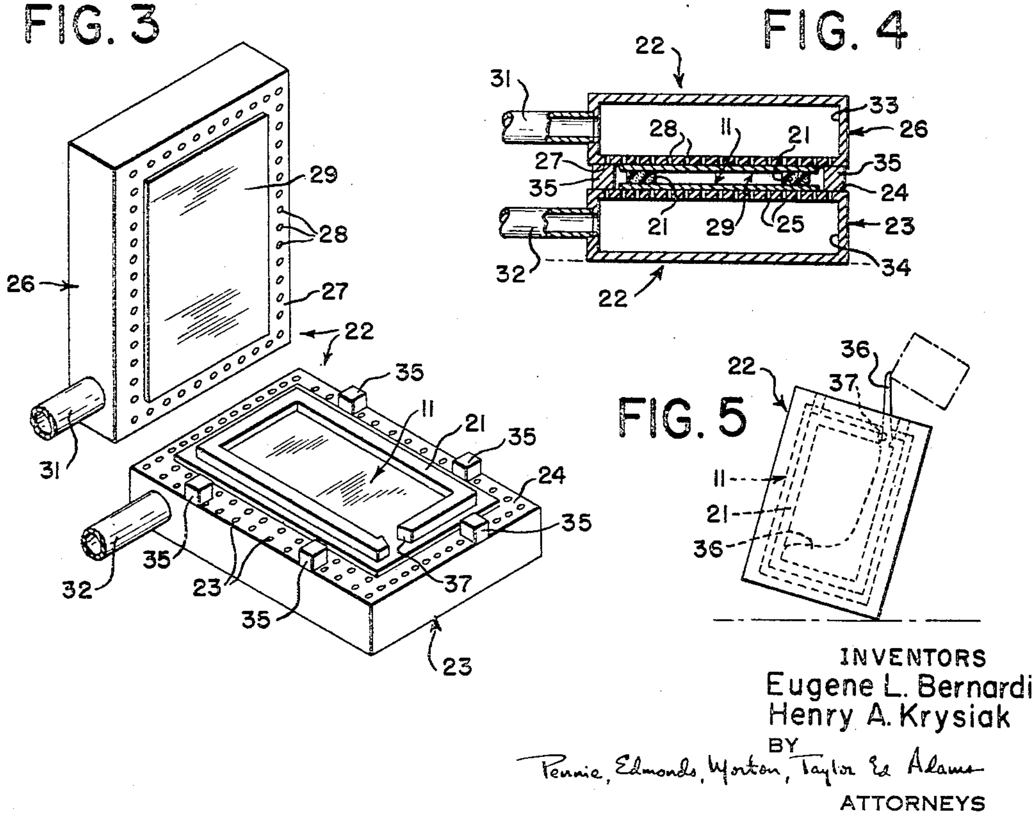
FIG. 3 is a perspective view of a modified structure used in forming a printing plate in accordance with the present invention.
FIG. 4 is a cross-sectional view of the apparatus of FIG. 3, with the structure in closed position.
FIG. 5 is an elevation view of the structure shown in FIG. 4 while a printing plate is being formed therewith.

Another embodiment of the invention relates to a closed box casting method, and utilizes the casting box 22 shown generally in FIGS. 3, 4 and 5. The box 22 includes a bed 23, which is substantially the same as the bed 13 described above, having a precision flat surface 24 with a multiplicity of vacuum holes 25. The mat 11 and cofferdam 21 are mounted over the bed 23 in substantially the same manner as with the bed 13. The box 22 further includes a back manner 26 with a flat precision surface 27 having a plurality of vacuum holes 28. A separator sheet 29 is placed on the surface 27 and drawn uniformly against it by means of the vacuum through the holes 28. A vacuum is provided at holes 25 and 28 through the provision of pipes 31 and 32 in communication, respectively, with the chambers 33 and 34 of the casting box. The back 26 is then disposed in overlying closed relation to the casting bed as shown in FIG. 4 with spacing blocks 35 being provided between the two members along the margins thereof to assure that the surfaces 24 and 27 are precisely parallel. It will be noted that the cofferdam 21 is made of relatively flexible material, e.g., sponge rubber, whereby the separator sheet 29 will be compressed resiliently against the dam. Thus, the spacers 35 delimit the amount of compression of the cofferdam between the back member and the casting bed. Suitable clamp means (not shown) are provided to secure the casting bed and back member together in closed position. The next step is to position the casting box in a slightly tilted generally vertical position as shown in FIG. 5. The liquid resin composition 36 can then be poured through an aperture 37 provided in the cofferdam wall, until the casting space is substantially filled. After the resin composition has gelled, the box can be opened and the cast plate removed from between the separator sheet and mat. The closed box method assures that the cast plate will have a uniform thickness, without need for shaving the back with a planing machine. Other advantages of the closed box method, in addition to the function of tilting the box, will become apparent hereinafter.

Both of the foregoing procedures, however, only set forth the general methods that can be used in accordance with the present invention. The liquid resin compositions used to make plastic printing plates in accordance with the present invention are essentially thermosetting polymer systems, including polyester resins, epoxy resins, polyurethanes, silicones, which are capable of setting to a dimensionally stable, solid, infusible and insoluble casting.

The thermosetting polymer system, as well as the catalyst or curing agent, may be selected from broad classes of compositions. The choice of polymer and catalyst is only limited by the constraints placed thereon by the particular nature of the process of producing printing plates, and by the general use in the newspaper and magazine trades to which such plates will be put. Generally, these requirements may be listed: the resin composition prior to casting must be fluid or must be reducible to the fluid state by the application of heat, before the addition of the catalyst. The maximum viscosity of the particular liquid resin composition ought not to exceed about 1000 poises at 25° C. The liquid resin composition (containing thermosetting polymer system and catalyst mixture) must be free of volatile matter and must not produce volatile substances during or after curing. Fairly rapid curing times (from one minute to ten minutes) are also required with the use of suitable catalysts or curing agents. Moreover, the cured resin must be capable of reproducing accurately the detail of the surface against which it is cast and cured, that is possess high image fidelity, and must not react with that surface. The cured resin system must also have sufficient strength when partially or wholly cured to allow handling, trimming and machining, and must have some flexibility when cast in thin sections in order to allow bending over various curved surfaces. In addition, the cured resin system must have good wear resistance in the printing operation, and must further have the property of accepting and transmitting the various kinds of ink used in commerce, without reacting physically or chemically with the oils, solvents or other chemicals in commercial inks.

With respect to the catalyst or curing agent, it is required that the catalyst or catalysts selected for use with the curable resin, must be capable of being readily mixed with the resin or resins and must be commercially available at relatively low cost. Preferably, the catalyst should be a low viscosity liquid or a readily dissolvable solid or paste.

It has been found that polyester resins meet the requirements delineated above to a remarkable extent. Polyurethanes and epoxy resins are also highly satisfactory. Silicone elastomers are also suitable although they are not as efficacious as the preceding types of resins.

Generally, with polyester resins, peroxide or hydroperoxide catalysts are preferred, as well as any kinds of catalytic agents may be utilized depending upon the resin used. Thus, free radical producing catalysts may advantageously be employed with polyester resins; and epoxy resin hardening catalysts (broadly classified) are used with epoxy resins.

The polyester resins of interest in the present invention may be generally termed "unsaturated polyesters." They comprise a mixture or mixtures of the reaction products of (a) one or more polyhydric alcohols with (b) one or more dibasic acids, at least one of the reactants containing ethylenic unsaturation, and (c) a polymerizable monomer containing carbon-to-carbon unsaturation. Unsaturated polyesters are capable of cross-linking to form thermoset resinous materials and are readily available and well known to the art.

These unsaturated polyester resins may be prepared, for instance, by esterifying one or more polyhydric alcohols and one or more alpha, beta ethylenically unsaturated dicarboxylic acids and thereafter blending the resultant unsaturated alkyd with a stabilizer and a polymerizable monomer or a cross-linking agent having at least one $—C{=}CH_2$ group, the polymerizable monomer constituting 5 percent to 95 percent by weight of the resin mixtures, but preferably 20 percent to 65 percent of the weight thereof. In general, polyester resins are mobile liquids and will convert readily to solid materials under proper conditions. They are essentially 100 percent reactive and evolve no gas or like by-products during curing.

The polyhydric alcohols, or glycols, used for producing these unsaturated polyester resins may be either aromatic glycols or straight or branch chain aliphatic glycols of relatively low molecular weight, or mixtures thereof; for instance, saturated or unsaturated aliphatic glycols such as ethylene glycol, propylene glycol-1, 2-propylene glycol-1, 3-butylene glycol-1, 2-butylene glycol-1, 4-pentane diol-1,5, the hexylene glycols, neopentyl glycol, 2-butene-1,4 diol, 2-methyl-3-butyn-2-ol, 3-methyl-1-pentyl-e-ol. They also include dihydroxy polyethers, such as diethylene glycol, dipropylene glycol, triethylene glycol and the high polyglycols of waxy consistency as well as cyclo-aliphatic diols.

The dibasic acids typically used are saturated acids such as phthalic anhydride, isophthalic acid, terephthalic acid and the like, such linear dibasic acids as oxalic acid, adipic acid, and the like, and such unsaturated acids as maleic acid, maleic anhydride, fumaric acid, etc. Special modifying reactants such as monobasic acids, rosin, and certain polyols, such as glycerine, pentaerythritol, and the like, are sometimes used for special effects.

The dibasic acids and glycols are usually reacted in approximately equimolecular ratios, with preferably a slight excess of hydroxyl groups from the glycols (acid numbers in range from 5 to 80 and preferably between 20 and 50) to form resins varying in viscosity from very viscous fluids to solid-brittle materials having different melting points. The alkyd resins so formed is usually mixed with an unsaturated ethylenic, polmerizable monomer such as styrene, vinyl toluene, methyl-methacrylate and the like, or mixtures of such monomers, to form the polyester solutions. The monomer polymerizes with the alkyd resin when mixture is cured. It will be realized that considerable variation in end properties of the uncured polyester is possible by varying the amounts and types of dibasic acid, glycols and monomers as well as by varying the methods used in preparing these resins.

Polyester resins are classified as rigid and resilient types. A rigid resin will exhibit only very limited elongation in tensile strength at room temperature, approximately 5 percent or less; while a resilient resin will show an elongation at tensile strength at 25 percent, 50 percent, or more. Rigid resins may be made more resilient either by modification with a separate resilient resin, by the use of compatible plasticizers, or by choice of original ingredients when originally produced. Polyester resins are further classified as being of low, medium, and high reactivity depending on the ratio of unsaturated dibasic acid to saturated dibasic acid, with high reactivity resins having a high amount of unsaturated dibasic acid.

The polyester resin solutions are cured with catalysts of the peroxide type, such as methyl ethyl ketone peroxide (commercially available as a 60 percent active solution in dimethyl phthalate), benzoyl peroxide (available in the pure form as coarse powder or as a paste in 50 percent or 55 percent concentration in a plasticizer such as dibutyl phthalate or trycresyl phosphate), cyclohexanone peroxide, lauroyl peroxide, cumene hydroperoxide, tertiary butyl perbenzoate, etc., or mixtures of these catalysts. In conjunction with these catalysts, there is usually employed a material commonly termed "a promoter" which in turn initiates polymerization between the alkyd resin and the reactive monomer system. Such promoters include cobalt octoate, cobalt naphthenate, dimethyl aniline, and the like, and certain quaternary ammonium compounds. Heat will also cause the various peroxides to form free radicals and can thus act as a promoter in accordance with the the usual rule that increased temperature causes faster rates of reaction. Thus, some catalysts will react even at room temperature. Heating the polyesters above room temperature is sometimes desirable in order to maximize the cure and obtain optimum physical properties in minimum time.

By varying the type of polyester resin, the quantity and type of reactive monomer, the quantity and type of curing agents, and/or promoter, and the temperature of the cure, it is possible to control over a very wide range the viscosity of the uncured resin-promoter system, the curing ratio and pot life thereof, and the resulting physical characteristics of the cured product. Thus, pot life may vary from less than a minute to a day; viscosity may vary from very fluid to quite viscous; and hardness, flexibility and toughness may also be controlled within wide ranges to suit a wide variety of end uses. It is readily possible to add pigments to these resins to provide color (for color coding) and opacity, or to add fillers to provide greater hardness, less shrinkage on curing, or lower costs.

A preferred composition for use in the present invention is a polyester resin containing from about 20 percent to 65 percent by weight of styrene. In accordance with the preceding discussion, this solution may comprise substantially all flexible polyester resin, or a suitable mixture of flexible and rigid polyester resins. Any ethylenically unsaturated monomer, including vinyl toluene, diallyphthalate, styrene divinyl benzene mixtures, methylmethacrylate, ethyl acrylate, or mixtures of the foregoing may be used in place of styrene. Small amounts of inhibitor such as hydroquinone or t-butyl catechol are generally added to the resin-monomer mixture to impart better stability to the solution prior to use. The polyester resin is cured with catalysts of the peroxide type described above. A preferred liquid resin mixture from which the printing plates of this invention may be produced comprises from about 90 percent to 97 percent by weight of the polyester resin (or resins), from about 1 percent to 8 percent by weight of organic peroxide catalyst and from about 0.5 percent to 2 percent by weight of a free radical promoter for the catalyst. Additionally, the preferred liquid polyester resin of the type just described contains a liquid ethylenically-unsaturated monomer which copolymerizes with said polyester resin mixture on curing (e.g. styrene), the monomer constituting from about 20 percent to about 65 percent of the total weight of the polyester resin. Curing in situ may be accelerated by heating the resin to from about 70° F. to 200° F. If this be done, stabilization of gel time can be obtained regardless of the ambient conditions. Thus if the resin mixture is heated to a standard 120° F. before pouring, the gel time of the particular resin system will remain constant regardless of the temperature of the room in which the plastic plates are being prepared.

The following examples are illustrative of the ease with which plastic printing plates may be produced in accordance with the invention.

EXAMPLE I

As an example of a plastic printing plate formed from polyester resin in accordance with the present invention, a flexible resin was prepared by esterifying 1.98 moles of isophthalic acid, 1 mole of adipic acid and 4.72 moles diethylene glycol to an acid number of 50. 1.5 moles of maleic anhydride was then added. At an acid number of 25, the esterification was terminated. The resin thus prepared was then mixed with 40 percent styrene reactive monomer. Into 1000 parts by weight of this resin mixture, there was incorporated 2 parts by weight of dimethylaniline and 5 parts by weight of cobalt naphthenate (promoters). A catalyst mixture of 10 parts by weight of methyl ethyl ketone peroxide and 40 parts by weight of benzoyl peroxide was then added and mixed, with the entire mixture being poured into a suitable mat in accordance with the general procedure outlined above for an open bed casting. The mixture gelled and reached its initial cure in less than two minutes, after which the plastic casting was removed from the mat. A post-cure was then performed by heating the cast for about five minutes at about 250° F.

The relatively large proportion of promoters and catalysts used in the foregoing example enabled the printing plate to be formed in an extremely short period of time, as compared to the time it normally takes for most other polyester resin molding operations. Since, however, the plate thus formed is relatively thin and has a wide area for cooling, it is possible to take advantage of this shortened gel time since the heat generated by the reaction is dissipated without causing the cast to burst from within as a result of non-uniform curing. In order to cure the exposed surface of the printing plate, it has been found helpful to spread wax over this surface as the plate begins to gel. This allows the surface to cure, whereby it is not tacky and the plate is readily handled. In the closed box procedure noted above, it is similarly advantageous to spread wax liberally over the exposed surface of the separator sheet. Preferably, the separator sheet is formed of a thin chrome metal plate, although ether materials that do not adhere to the resin are suitable. A small proportion of wax or wax-like material may also be dissolved in the heated resin in lieu of, or in conjunction with, spreading wax over the exposed side of the plate, as previously described. In addition to promoting surface cure of the plate, the incorporation of the wax in the resin imparts to the resin a release characteristic giving the casting a glossy feel and causing it to release from the mold very easily. For these purposes, paraffin wax has yielded excellent results. In an additional run similar to the preceding example, paraffin wax was incorporated in the styrene in an amount equal to about 1.5 percent by weight of the monomer. The resulting plate had excellent fidelity and a non-tacky surface. An emulsifier, such as sorbitan trioleate may be substituted for the paraffin wax. For this purpose sorbitan trioleate, known commercially by its trade name Span 85, has been used with advantage. For example, 1.5 percent of Span 85, based on the weight of the resin, was added to the resin mixture as a 10 percent solution in styrene and thoroughly dispersed in the resin. Upon casting, a very pronounced improvement in release from the mold was noted.

EXAMPLE II

Fifty parts by weight of the polyester prepared according to the procedure outlined in Example I was mixed with 0.005 percent by weight dimethyl aniline. Another separate mixture was also prepared comprising 2 parts by weight of benzoyl peroxide and 50 parts by weight of the polyester of Example I. Immediately prior to the time when casting of the plate was deemed suitable, the two mixtures were intermixed and then poured into the casting box. The bed temperature of the box was maintained at 180° F., the lid of the box at 210° F. After two minutes, the plate was removed from the matrix, tack-free and with excellent fidelity. The hardness was in the Shore D scale.

An important feature of the present invention relates to the short time in which a plastic plate can be poured and completely cured. The use of promoters in achieving this result must be carefully controlled. If too much promoter is used, the reaction becomes too violent, and the resin may shatter or crystallize. The resulting printing plate is then unusable.

In the use of resins such as polyester resins, a problem is encountered with respect to the filling of all the contours of the mat image by the liquid resin mixture. Air bubbles tend to form on the face of the mat because the surface tension of the resinous material prevents it from penetrating into the sharp indentations of the mat. Consequently, the resulting plate casting would not be satisfactory, producing indistinct and incomplete relief images. To overcome the foregoing problem, and to meet the highly exacting requirements of the printing art, a wetting agent may be applied to the face of the mat prior to pouring in the resin. The wetting agent serves to draw the resin against all surfaces of the mat. The most successful wetting agents are the monomers of the resin used, which readily cross-link or polymerize with the resin molecule chain during curing to form larger molecules. With polyester resins, the cross-linking wetting agent preferably used is styrene, although methylmethacrylate and vinyl-toluene are also suitable. Other solvents such as alcohol, toluene, xylene and acetone may be used, although these do not have the cross-linking feature of the foregoing. Nevertheless, these solvents act as good wetting agents by changing the surface tension between the mat surface and the resin.

Although the use of the wetting agent solves the problem of air entrapment, another problem is created by the wetting agent, per se. In particular, is is difficult to apply the wetting agent to a horizontally disposed mat without excess application in some regions, whereby puddles may be formed. These puddles do not cure properly, and a deflective cast results. To overcome this problem, the cast bed, shown in FIGS. 1 and 2, may be mounted on a shake table, whereby an oscillating vibratory movement of about 1400 to 1800 r.p.m. is imparted to the mat. The resin mixture is poured while such vibration takes place, with the wetting agent being mixed in with the resin to eliminate any puddles. The vibration is ceased before the resin begins to gel. In this manner, the problem of air entrapment with the open bed casting procedure is fully overcome.

Another procedure for eliminating the problem of wetting agent puddles does not require the provision of vibration during the pouring procedure. It has been found that by pouring the resin from one end of the mold continuously across the face thereof to the other, the excess styrene will in effect be swept along in front of the resin being poured and thereby flowed off of the mat. In a mass production system, this procedure may be preferable to that of providing vibration.

In the closed box procedure noted above, there is no problem of puddles forming on the face of the mat when a wetting agent is applied, since the mat is generally vertically disposed while the resin mixture is being poured. It is important, however, to allow the air in the casting space to be removed as the resin is poured in, in order that the air is not trapped to form bubbles in the plate. In this regard, the casting box 22 is tilted slightly as shown in FIG. 5, so that the resin 36 poured in through the aperture 37 flows down one side of the casting space until it reaches bottom, after which it begins to fill and move upwardly along the other side of the casting space. As the resin thus moves upwardly, the air is forced out of the casting space through the aperture 37, as is any excess wetting agent left on the face of the mat. The difficulties due to air entrapments may also be avoided, without having to resort to the use of a wetting agent or a shake table, by pouring the resin onto the mat at a viscosity not exceeding 250 cps. and preferably below 150 cps. This reduction in viscosity may be effected by heating the resin prior to adding same to the catalyst, or by increasing the proportion of styrene or other polymerizable monomer, in the polyester resin. When the proportion of styrene or other monomer is increased, it will usually be found desirable to increase the proportion of the promoter and catalyst employed, or to heat the casting box, or both, in order to bring the casting cycle within a practical time period. Surface activity of the mat should be taken into account in determining the optimum pouring viscosity of the resin composition.

The mat from which the plastic plate is to be formed is preferably composed of a material that does not adhere to the cured resin. For use with polyester resins, thermoplastic materials of the polyolefin family have been found very satisfactory in this regard, and in this family polypropylene is preferred because of its durability and detailed molding ability. An additional advantage of polypropylene is its ability to withstand extremely high temperatures created by the reaction of polyester resins and catalysts, where relatively large amounts of promoters are used. Other suitable materials include polyvinyl acetate, and Bakelite (an infusible phenolic resin manufactured by the Bakelite Division of Union Carbide Corporation).

The wood and cellulose fiber mat normally used in the newspaper industry is not wholly efficacious for use in molding the curable resins in this invention, since the mat sticks to the resin. A relatively new mat material having a special coating, however, manufacturel by the Wood Flong Company, N.J., has been found generally satisfactory for use with polyester resins, and is also embossed in the same manner and with the same equipment as the normal newspaper mats. Thus, mats capable of use in accordance with the present invention can be formed either by "cold rolling" newspaper techniques, or by thermopressure techniques, whichever is desirable.

It will be appreciated from the foregoing description that one of the important advantages of the invention is the ease and quickness with which a plastic printing plate can be formed, and the capability of pouring a liquid mixture at relatively low temperatures or even at room temperature to form a plate rigid enough to be handled.

To summarize briefly the procedure described with regard to a polyester resin used with the open bed shown in FIGS. 1 and 2, a mat is first placed on the bed surface with the vacuum drawn to maintain the mat perfectly flat. After the cofferdam is formed around the bearer of the mat, a styrene wetting agent is applied by a sponge or the like to the exposed mat face. The vibrator is turned on, and the mixture of resin, catalyst, and promoter is poured over the mat. After a short period, generally less than one minute, the vibration is stopped, and the resin will generally complete its initial gel in less than two minutes. As the gel begins to take place, wax is spread over the exposed reverse side of the plate to enable it to surface cure. Additionally or in the alternative, wax may be incorporated in the resin mixture. The cast is then separated from the mat, and heated by an oven or lamps for postcure if necessary. The cast is then shaved on its reverse side by means of a planing machine to provide a uniform and predetermined thickness.

By varying the proportion of flexible to rigid polyester resin, and by suitable selection of the catalyst and promoters, the degree of hardness and amount of flexibility in the final plate can be readily adjusted within a relatively broad range of characteristics, and thereby fulfill the requirements of various and diverse needs as outlined herein.

As previously described, an important use of the instant plastic plate is to take the place of the flat mats presently being used by advertizers and other for widespread distribution to newspapers, magazines, and other publications. A large number of plastic plates can be readily produced instead of the mats, with the plates themselves being distributed. A newspaper, for example, receiving such a plastic plate can use it directly in making up the page forms, and thus the need for pouring a molten lead flat plate casting from a mat is eliminated. A plastic plate used to emboss into a "cold rolled" mat is preferably made to be somewhat rigid and hard, to assure sharp and defined penetration into the mat.

EXAMPLE III

A polyester resin was prepared by esterifying maleic anhydride phthalic anhydride and propylene glycol in a mol ratio of 1:1:2.1 (5 percent excess glycol). The reaction was conducted at about 210° C., and a carbon dioxide sparge maintained an inert atmosphere over the reaction mixture while also aiding the removal of the water of esterification. Esterification was terminated at an acid number of 34 and the product was inhibited with 0.008 percent by weight hydroquinone. One thousand parts by weight of this polyester was mixed with 4 parts by weight of a 6 percent cobalt octoate solution, 5 parts by weight dimethyl aniline and 20 parts by weight methyl ethyl ketone peroxide. The resulting mixture was heated to a viscosity of about 200 cps. and then poured onto the matrix of the casting box. The lid and bed of the box were maintained at 180° F. After three minutes, a rigid printing plate, exhibiting a good relief image and having a Barcol Hardness of 38, was removed from the box. The plate formed according to this example were relatively rigid, and not sufficiently flexible to allow it to be formed or bent into a cylindrical shape for mounting on a rotary press. A problem in this regard, however, is that a plate that is made too flexible will have a face that is too resilient for use on the same rotary press cylinder along with other lead plates. More specifically, in the newspaper industry, a generally elongated cylinder is used that has as many as four printing plates spaced longitudinally thereon, with these four plates serving simultaneously to print four pages of the newspaper. The four pages are subsequently cut and folded as desired. It is important that a plastic printing plate used along side one or more lead plates shall have a sufficient hardness to enable the plastic plate to exert sufficient pressure on the paper to make a good print. If the plastic printing plate used is of insufficient hardness, the lead plates will determine the extent to which the plastic plate will be allowed to bear against the paper, and if the plastic plate is not of sufficient hardness, it will not make firm enough contact with the paper.

Where plastic plates are to be used in a rotary press or other system without lead plates being used along side them, it is not necessary to provide very rigid plates. A more flexible plate is mounted more readily on a rotary press inasmuch as it is easily bent into an arcuate form. Although the more flexible the plate is, the lower its hardness is, this characteristic has not been found to detract from the quality or detail of the reproduction made.

EXAMPLE IV

As an example of a plate made in accordance with the present invention suitable for use in an all plastic plate printing system, the following formula and procedure was used: 600 parts by weight of flexible polyester resin (Example I) and 200 parts by weight of rigid polyester resin (Example III) were mixed into a liquid solution additionally containing 80 parts by weight of styrene monomer, 4.4 parts by weight cobalt naphthenate, and 1.77 parts by weight dimethyl aniline. From this information, enough material was taken to make a cast, and 4.0 percent by weight benzoyl peroxide and 1.0 percent methyl ethyl ketone peroxide were then mixed into the solution (percentages again by weight). The mixture was poured into a polypropylene matrix set up on a flat horizontal casting bed in accordance with the open bed procedure noted above. The resin mixture gelled in less than one minute, and was removed from the mat in about three minutes. The case so removed was then post-cured at 250° F. for about five minutes. The resulting cast plate had sufficient resiliency to allow its ready mounting on a cylindrical rotary press. Since the plate did not have a stretching characteristic, it is therefore suitable for accurate mounting on a rotary press with clamps or other mechanical fastening devices.

Although the use of a so-called room-temperature catalyst (e.g., methyl ethyl ketone peroxide) need not be used where sufficient heat is applied, we have also found that a superior casting and a superior process is obtained by using a room-temperature catalyst, advantageously methyl ethyl ketone peroxide in conjunction or admixture with, benzoyl peroxide or like catalyst with which heating is advantageous.

A material which we have found especially effective as a curing agent for the polyester resins, when employed in accordance with our present invention, is acrylic acid used in proportions ranging from about 2 percent to about 10 percent by weight of the resin. This curing agent has been found materially to reduce curing time. Also, its use is especially desirable when a dye is to be incorporated in the resin. For instance, a dye, such as Sandoz dyestuffs, may with advantage be dissolved directly in the acrylic acid before adding same to the resin mixture. The dyestuff serves to give the casting enough opacity to enable the operator to check the surface of letters and screens, and also facilitates color coding. Further, the acrylic acid when so used tends to eliminate the sticky, gummy surface which is normally inherent in flexible resins, making the resultant plates more readily handled. The following examples are illustrative of this modification of the invention.

EXAMPLE V

A polyester resin was prepared by reacting to an acid number: 12, 2.5 moles phthalic anhydride, 1.0 moles maleic anhydride, 1.0 moles adipic acid and 4.72 moles of diethylene glycol. The alkyd was inhibited by the addition of 0.008 percent by weight of hydroquinone. The resin was thinned by mixing 68 parts by weight thereof with 32 parts by weight of styrene (containing 0.006 percent by weight of tertiary butyl catechol). 100 parts by weight of this product was mixed with 30 parts by weight of styrene containing 1.5 percent by weight of paraffin wax, 3 parts by weight of acrylic acid, 0.2 part of 6 percent cobalt octoate solution, 0.5 part by weight dimethyl aniline and 1 part by weight methyl ethyl ketone (in that order). The resin mixture was then poured into a casting box which had been heated to a temperature of 180° F. Ten minutes was sufficient to effect the cure. A hard printing plate, with a Shore D Hardness was removed from the casting box.

EXAMPLE VI

A polyester resin was first prepared by esterifying 5 moles of maleic anhydride, 14 moles of phthalic anhydride and 20 moles of diethylene glycol according to a procedure similar to that of Example I. Esterification was terminated at an acid number of 34. The resin was thinned with styrene in the ratio of 70 parts by weight alkyd and 30 parts by weight styrene. 0.005 percent tertiary butyl catechol had been added to the styrene. 100 parts by weight of this mixture was then mixed with an additional 40 parts by weight of styrene, 0.2 part by weight of a 6 percent cobalt octoate solution, 0.5 part by weight dimethyl aniline, 2 parts by weight of acrylic acid into which had been incorporated 2 percent by weight of Sandoz dye, and 2 parts by weight methyl ethyl ketone peroxide, in that order. The resin was cast in a suitable casting box having a bed and lid temperature of 180° F. The acrylic acid modification substantially lessened cure time: the cast was removed from the box in a fully cured condition after 4 minutes. The plate had a Shore A Durometer reading of 95 and had very good hot strength and excellent fidelity.

As hereinbefore noted, epoxy resins and polyurethanes are highly satisfactory resins suitable for use in this invention. The designation "epoxy resin," as generally understood by the art and as used herein, applies to a class of glycidyl polyethers which may be cured to form a hard, tough resinous product and which are generally produced by reacting epichlorhydrin and a polyhydric phenol or alcohol, the epoxy equivalent being subject to considerable variation. Notable among the epoxy resins is the reaction product of epichlorhydrin with bis-phenol.

Low molecular weight epoxy resins having fluid viscosities which are of interest in the processes of this invention are produced when the proportion of epichlorhydrin to bis-phenol is approximately 3 to 2. It is possible to modify the properties of the cured epoxy resin by incorporating various modifying materials into the initial reaction mixture. Such materials as polyethylene or polypropylene, polyglycols and epoxidized dimer acids may be used to provide greater flexibility in the cured epoxy resin.

Epoxy resins are cured by using a hardening catalyst (hardener) which is preferably added in the correct stoichiometric amount. It is also necessary to insure thorough mixing of resin and hardener. The polyester reaction mechanism discussed above is a free radical reaction and its initiation does not depend on thorough mixing. When hardener and resin are mixed, the resulting blend generally has a limited pot life and must be used before hardening has progressed to far. Pot life can be varied from minutes to days by a choice of proper hardener. Extended pot life can be obtained by using hardeners which require heat to initiate the curing mechanism.

The hardeners commonly used with epoxy resins include such materials as ethylene diamine, diethylene triamine, triethylene tetramine, metaphenylene diamine, diaminodiphenyl sulfone and certain reaction products of basic epoxy resins and poly-functional amines, both aromatic and aliphatic. The basic anhydrides such as phthalic anhydride, hexahydrophthalic anhydride, maleic anhydride and the like can be used where a heat cure is efficacious. This results in a longer pot life.

For the purposes of the present invention, it is considered that the epoxy resins and hardeners of most interest are either the flexible epoxy resins and regular hardeners or standard epoxy resins and flexibilizing hardeners or combinations of both types. These flexibilizing hardeners include polyamides (such as General Mills' "Versamide" or the 37–611 Hardener of Reichhold Chemicals, Inc.), polysulfides (Thiokol LP–3 for example) or the special flexibilizing hardeners, for example the Reichhold 2611 or 2613. A generally preferable mixture for the purposes of this invention comprises from about 45 percent to 85 percent by weight of an epoxy resin (or resins) and from about 15 percent to 55 percent by weight of an epoxy resin hardening catalyst.

EXAMPLE VII

One hundred parts by weight of diglycidyl ether of bis-phenol A were thoroughly mixed with 65 parts by weight of a known epoxy hardener comprising 48 parts by weight of an amino lower alkyl piperazine and 102 parts by weight of a higher alkyl phenol. The above components were mixed at 140° F. and poured over a matrix using the closed box casting procedure while the mixture was still at 140° F. Both the top and bottom of the casting box had been previously heated to 185° F. A hard gel was obtained in 4½ minutes and the cast was immediately removed from the matrix and after trimming was immediately ready for the press. The cast epoxy plate was tough and showed good fidelity in direct flatbed and rotary press printing.

Among the resins suitable herein, polyurethane resins are superior. Polyurethane resins are generally the reaction product of di- or poly-functional isocyanates and polyhydroxy materials. The diisocyanate most advantageous is toluene diisocyanate, the commercial variety of which is the mixture of the 2,4-isomers (80 percent) and the 2,6-isomer (20 percent), and commonly referred to as TDI. Other diisocyanates may of course be used.

The polyhydroxy materials are usually either hydroxyl-terminated polyesters or polyglycols. The polyesters of interest are usually linear in character and hydroxyl-terminated. This implies the use of sufficient excess hydroxyl groups in the reaction to insure that each polyester molecule is at least difunctional with respect to the hydroxyl groups. A percentage of triols may also be used to give a desired degree of branching in the polyester structure and thus to insure the desired degree of cross-linking during the reaction with the toluene diisocyanate (or other isocyanate). The reactants used in the production of the polyesters may be such acidic materials as phthalic anydride, adipic acid, succinic acid, meleic anhydride, etc., reacted with such polyols as ethylene glycol, diethylene glycol and the like, along with lesser amounts of such polyols as glycerin, trimethylol ethane, pentaerythritol, etc., to provide the desired branching.

The polygylcols of primary interest are polyethylene glycols and polypropylene glycols of molecular weights in the range of 200 to 3000 and having hydroxyl contents from 1 percent to 25 percent. More functional glycols are also used in lesser quantities to provide desired branching and resultant cross-linking in the cured resin. Glycerine or trimethylol ethane-based polyglycols serve this purpose.

Catalysts are used in many cases to control the rate of the reaction. These include such materials as lead naphthenate, lead octoate or dibutyl-tin dilaurate. In some cases, it is desirable to make partial reaction products between the isocyanate and polyglycol in order to decrease the volatility of the isocyanate and to provide a more suitable viscosity in the ultimate reacting materials. These adducts are sometimes termed pre-polymers. With suitable variation in the types and amounts of reactants and catalysts, it is possible to produce a wide variety of finished products which can be varied in physical properties. In the case of the present invention, the products of primary interest would be urethane elastomers which are castable and curable at ambient or at slightly above ambient conditions yielding elastomers having up to 100 p.s.i. tensile strength, 30 percent to 300 percent elongation and excellent toughness, abrasion and chemical resistance. These characteristics make polyurethanes attractive in the product and proceses of this invention. A generally preferred method with respect to polyurethanes entails using a 100 percent liquid polyurethane resin, or a mixture of such resins, and after pouring the resin into the matrix and casting space, heating the material to a temperature of from about 100° F. to 200° F.

EXAMPLE VIII 785 parts of toluene diisocyanate were heated to 70° C. 215 parts of a propylene oxide adduct of sorbitol having a hydroxyl number of 490 were mixed therewith at a temperature of between 65° to 75° C.

This mixture was retained at about 70° C. for one hour. 1000 parts of poly (phenyl methylene isocyanate) was then added to the above mixture and allowed to cool to rom temperature to form a prepolymer.

A propylene oxide adduct of trimethylol propane having a hydroxyl number of 396 was dehydrated at 150° C. and 25 mm. mercury vacuum.

100 parts by weight of trimethylol propane adduct were then thoroughly mixed with 100 parts by weight of the prepolymer as prepared above, together with 2.0% of a dibutyl tin dioleate catalyst (10 percent tin).

The prepared polyurethane resin mixture was then poured onto a suitable matrix contained in a closed casting box. The top of the casting box had previously been heated to a temperature of 175° F. and the matrix contained in the casting box to 130° F.

The polyurethane plate was removed from the mold after one minute and after cooling was sufficiently cured to be used as a printing plate. The polyurethane printing plate after removal from the mold had a durometer of 80D and after 24 hours at room temperature had a durometer of 85D.

EXAMPLE IX

A prepolymer was prepared in the same manner as described above in Example VIII, using toluene diisocyanate propylene oxide adduct of sorbitol, and poly (phenyl methylene isocyanate).

A triolpropylene oxide adduct marketed by Union Carbide under the trade name of Triol LHT 240 was dehydrated at 150° C. and 25 mm. mercury vacuum. The product had a molecular weight of 700 and a hydroxyl number of 241.

100 parts by weight of the dehydrated triol were thoroughly mixed with 50 parts by weight of the prepolymer prepared as described in Example VIII, together with 0.90 percent by weight based on the total polymer of a dibutyl tin dioleate (10 percent tin). This mixture was then poured onto a suitable matrix contained in a closed casting box, in which the top of the casting box was heated to 175° F. and the matrix to 175° F. The casting box was closed and the polyurethane cast plate removed therefrom after three minutes. The resulting polyurethane printing plate when cooled was sufficiently cured to be used in a printing press. Upon demolding and cooling the plate had a durometer of 60A and after 24 hours at room temperature had a durometer of 80–85A.

In some of the above examples, a post-cure is used but the total cure time is still less than ten minutes. Although the invention is particularly directed to an extremely rapid single curing step (1 to 4 minutes) and where the plate once it is removed from the matrix and cooled is suitable for immediate use, these examples are included to illustrate that the invention also contemplates short post cures if this is desirable.

After the plate has been cast and cured, it can be removed immediately from the matrix and allowed to cool. This generally requires 4 to 5 minutes and a certain amount of post-curing or additional curing will occur during this cooling step. The time required for cooling of the plate need not be lost however since the plate while still warm can be handled, trimmed or machined if necessary, checked for possible imperfections, and mounted on the printing press. By the time these steps are performed, or any one of them, the plate will have cooled sufficiently to be ready for use.

The preferred method of this invention involves preheating of the resin catalyst mixtures to stabilize curing times and the pouring of the resin while still hot onto a matrix using a closed casting box in which both the top and bottom of the box have also been preheated to a temperature of at least about 150° F. and preferably 185° F. (for polyester resins). The temperature of the casting box can of course be varied both below 150° F. or above 185° F. depending upon the particular resin-catalyst system employed and the time in which it is desired to have a finished plate. During the curing of the plates an exotherm reaction occurs and internal temperatures may run as high as 320° F. to 350° F. with most polyester resins. The plate is removed from the matrix after it has been "cured," then trimmed, cooled and is then ready for the press.

The term "cured" discussed herein means that the resin has set sufficiently to be used as a printing plate on conventional presses either immediately after removed from the matrix or immediately after the cooling thereof. Generally, the the resins are 90 to 95 percent cured upon removal from the matrix and a more substantially complete cure occurs during the cooling period. Of course, removing the plate from the matrix at an earlier stage and giving it a short post-cure in order to render it suitable for printing so long as the total time is reasonably short will also come within the scope of this invention and the appended claims.

As previously discussed, a multiple catalyst system comprising a combination of a room temperature curing catalyst and a high temperature curing catalyst is a particularly advantageous system, especially with polyester resins. For example a mixture of polyester resin and an olefinically unsaturated monomer capable of copolymerizing therewith containing both a room temperature curing agent and a high temperature curing agent starts to cure and set almost immediately, and when preheated and poured into a heated matrix casting this cure is accelerated starting the exotherm reactions aid in activating the high temperature catalyst. The precuring by the room temperature catalyst increases the viscosity or gellation to an extend which prevents the "blowing" of the reaction mixture when the sharp exotherm sets in caused by the activation of the high temperature catalysts. The multiple catalyst system also aids in the curing of such polyester resins to form plates of good quality in a very short time of less than 4 minutes and even within 1 to 3 minutes.

The amount of each catalyst in the multiple catalyst system can be varied by those skilled in the art and will depend on other variables such as the particular resin system being used, the curing temperatures, presence or absence of accelerators and so forth. Generally a ratio of room temperature catalysts to high temperature of about 1:4 has been found to be acceptable in most cases.

Various room temperatures and high temperatures curing catalyst can be used according to this invention in addition to those specifically mentioned herein as will be apparent to those skilled in the art.

Plastic printing plates of excellent quality can thus be produced according to this invention and be ready for the press in less than 10 minutes and even more advantageously in within 1 to 4 minutes. The plastic printing plates of this invention are also superior in many respects to plastic plates disclosed in the prior art.

We claim:

1. The method of producing a plastic printing plate which comprises (i) pouring a liquid resin composition having a viscosity not exceeding about 250 cps. at the pouring temperature of said composition and which contains a thermosetting polymer composition and which is capable of being cured rapidly to a dimensionally stable solid having good ink transfer properties and high image fidelity onto a matrix having a relief image on one face thereof so that the liquid resin composition completely covers the image face of the matrix, said matrix being preheated to a temperature capable of curing the resin within a period of time not exceeding ten minutes, (ii) curing the liquid resin composition to its solid state at an elevated temperature over a period of time not exceeding ten minutes following the pouring of the resin composition onto the matrix without bonding the resin composition to the image face of the matrix, thereby forming a plastic printing plate having a high fidelity relief surface opposite that of the image face of the matrix, and (iii) removing the resultant plastic printing plate from the matrix.

2. The method of claim 1 in which the resin is cured at temperatures in the range from about 150° F. to about 200° F.

3. The method of claim 1 in which the curing of the liquid resin to its solid state is accomplished over a period of time not exceeding four minutes.

4. The method of claim 1 in which the resin contains a thermosetting polyester composition and an organic curing catalyst.

5. The method of claim 4 in which the liquid resin composition also contains an olefinically unsaturated monomer capable of copolymerizing with the polyester.

6. The method of producing a plastic printing plate in accordance with claim 5, in which the liquid resin composition comprises (a) from about 90 to about 97 percent by weight of a thermosetting polyester resin, (b) from about 20 to about 65 percent by weight of an olefinically unsaturated monomer capable of copolymerizing with the polyester resin, and (c) from about 1 to about 8 percent by weight of an organic peroxide catalyst for curing the polyester-monomer system, the weight percentages of the monomer in the liquid resin composition being based on the weight of the thermosetting polyester resin, all other percentages being based on the total weight of the liquid resin composition.

7. The method for producing a plastic printing plate in accordance with claim 5, in which the liquid resin composition also contains from about 0.5 to about 2 percent by weight of a wax-like compound to facilitate the release of the plastic printing plate from the matrix.

8. The method for producing a plastic printing plate in accordance with claim 5, in which the liquid resin composition also contains from about 2 to about 10 percent by weight of acrylic acid, based on the weight of the liquid resin composition.

9. The method of claim 1 in which the resin contains a thermosetting epoxy resin and a hardening catalyst for the epoxy resin.

10. The method of claim 1 in which the resin contains a thermosetting polyurethane resin and a curing agent therefore.

11. The method of claim 1 in which the liquid resin is preheated to a predetermined elevated temperature prior to pouring on a matrix to stabilize the subsequent cure time under varying ambient conditions.

12. The method of producing a plastic printing plate which comprises (i) pouring a liquid resin composition containing a thermosetting polymer composition and a curing agent capable of being cured fairly rapidly at temperatures in the range from ambient temperatures to about 200° F. and at pressures in the range from about atmospheric pressure to not more than about 400 p.s.i. to a dimensionally stable solid having good ink transfer properties and high image fidelity onto a horizontally mounted matrix having a relief image on one face thereof facing upwardly so that the liquid resin composition completely covers the image face of the matrix, (ii) vibrating the matrix while pouring the liquid resin composition and then discontinuing the vibration of the matrix before the liquid resin composition undergoes complete gelation, (iii) curing the liquid resin composition to its solid state while within the matrx over a period not exceeding ten minutes from the completion of the pouring of the resin composition without bonding the resin composition to the image face of the matrix, thereby forming a plastic printing plate having a high fidelity relief surface opposite that of the image face of the matrix, and (iv) removing the resultant plastic printing plate from the matrix.

13. The method of producing a plastic printing plate which comprises (i) coating a matrix having a relief image on one face thereof with a wetting agent so that the wetting agent substantially covers the image face of the matrix, (ii) pouring a liquid resin composition containing a thermosetting polymer composition and a curing agent capable of being cured fairly rapidly at temperatures in the range from ambient temperatures to about 200° F. and at pressures in the range from about atmospheric pressure to not more than about 400 p.s.i. to a dimensionally stable solid having good ink transfer properties and high image fidelity onto the matrix so that the liquid resin composition completely covers the image face of the matrix, (iii) vibrating the matrix while pouring the liquid resin composition and then discontinuing the vibration of the matrix before the liquid resin composition undergoes complete gelation, (iv) curing the liquid resin composition to its solid state while within the matrix over a period not exceeding ten minutes from the completion of the pouring of the resin composition without bonding the resin composition to the image face of the matrix, thereby forming a plastic printing plate having a high fidelity relief surface opposite that of the image face of the matrix, and (v) removing the resultant plastic printing plate from the matrix.

14. The method of producing a plastic printing plate in accordance with claim 13, in which the wetting agent is styrene and the liquid resin composition comprises a thermosetting polyester resin and a curing agent.

15. The method of producing a plastic printing plate which comprises (i) placing a generally planar matrix having a relief image on one face thereof on a casting bed having a flat surface approximately horizontally disposed so that the matrix overlies the flat approximately horizontal surface of the casting bed with its relief image facing upwardly, (ii) forming a vacuum between the flat surface of the casting bed and the overlying matrix to draw the matrix uniformly against the underlying surface, (iii) coating the matrix with a wetting agent so that the wetting agent substantially covers the image face of the matrix, (iv) pouring a liquid resin composition which comprises a thermosetting polymer composition and a curing agent and which is capable of being cured fairly rapidly to a dimensionally stable solid having good ink transfer properties and high image fidelity onto the matrix so that the liquid resin composition completely covers the image face of the matrix, (v) vibrating the casting bed and the matrix while pouring the liquid resin composition and then discontinuing the vibratory movement before the liquid resin composition undergoes complete gelation, (vi) continuing the vacuum between the matrix and the casting bed until the resin composition gels sufficiently to form a printing plate having a high fidelity relief surface opposite that of the image face of the matrix, and (vii) removing the resultant plastic printing plate from the matrix and post-curing the plate by the application of heat.

16. The method of producing a plastic printing plate which comprises (i) pouring a thermosettable polyester liquid resin composition having a viscosity not exceeding about 250 cps. at pouring temperature of said composition and a multiple catalyst system comprising a room temperature curing catalyst and a high temperature curing catalyst and which is capable of being cured rapidly to a dimensionally stable solid having good ink transfer properties and high image fidelity onto a matrix having a relief image on one face thereof so that the liquid resin composition completely covers the image face of the matrix, said matrix being preheated to a temperature capable of curing the resin within a time not exceeding ten minutes, (ii) curing the liquid resin composition to its solid state at an elevated temperature over a period of time not exceeding ten minutes following the pouring of the resin composition onto the matrix without bonding the resin composition to the image face of the matrix, thereby forming a plastic printing plate having a high fidelity relief surface opposite that of the image face of the matrix, and (iii) removing the resultant plastic printing plate from the matrix.

17. The method of claim 16 in which the thermosettable resin is a polyester in combination with an olefinically unsaturated monomer capable of copolymerizing with the polyester.

18. The method of claim 17 in which the room temperature catalyst is an alkyl ketone peroxide and the high temperature catalyst is a benzoyl peroxide.

19. The method of claim 17 in which the liquid resin is preheated to a predetermined elevated temperature prior to pouring on a matrix to stabilize the subsequent cure time under varying ambient conditions.

References Cited

UNITED STATES PATENTS 2,985,615 5/1961 Tunteler et al. ___ 101—401 XR
3,145,654 8/1964 Johnson et al. _____ 101—401.1

FOREIGN PATENTS 614,993 12/1948 Great Britain.
713,990 8/1954 Great Britain.

OTHER REFERENCES

Bjorksten: Polyesters and their applications, Reinhold Publishing Co., New York, (1956) TP986. P685., pp. 48, 119, 144, 161, 169, 170, 172, 286–289.

DAVID KLEIN, Primary Examiner

U.S. Cl. X.R.

260—861; 264—299